(12) United States Patent
Kim et al.

(10) Patent No.: US 8,373,161 B2
(45) Date of Patent: Feb. 12, 2013

(54) ORGANIC THIN FILM TRANSISTOR

(75) Inventors: Do Hwan Kim, Seoul (KR); Hyun Sik Moon, Seoul (KR); Byung Wook Yoo, Yongin-si (KR); Sang Yoon Lee, Seoul (KR); Bang Lin Lee, Suwon-si (KR); Jeong Il Park, Seongnam-si (KR); Eun Jeong Jeong, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/346,119

(22) Filed: Jan. 9, 2012

(65) Prior Publication Data

US 2012/0104377 A1    May 3, 2012

Related U.S. Application Data

(62) Division of application No. 12/379,856, filed on Mar. 3, 2009, now Pat. No. 8,114,704.

(30) Foreign Application Priority Data

Sep. 18, 2008   (KR) .................. 10-2008-0091631

(51) Int. Cl.
*H01L 35/24* (2006.01)
*H01L 51/00* (2006.01)
(52) U.S. Cl. .............. 257/40; 257/66; 257/E51.007; 257/E51.027; 257/E21.328; 438/99; 438/149; 438/151; 438/161; 438/795
(58) Field of Classification Search .............. None
See application file for complete search history.

(56) References Cited

U.S. PATENT DOCUMENTS

| 7,285,440 | B2 | 10/2007 | Dimitrakopoulos et al. |
| 7,579,223 | B2 | 8/2009 | Wada et al. |
| 2004/0161873 | A1 | 8/2004 | Dimitrakopoulos et al. |
| 2005/0045885 | A1 | 3/2005 | Kim et al. |
| 2006/0289858 | A1 | 12/2006 | Park et al. |
| 2007/0194386 | A1 | 8/2007 | Hahn et al. |
| 2008/0067504 | A1 | 3/2008 | Park et al. |

FOREIGN PATENT DOCUMENTS

| JP | 2005-079598 | 3/2005 |
| KR | 10-2006-0078007 | 7/2006 |
| KR | 10-2007-0082676 | 8/2007 |
| KR | 10-2008-0025875 | 3/2008 |

*Primary Examiner* — Zandra Smith
*Assistant Examiner* — Khanh Duong
(74) *Attorney, Agent, or Firm* — Harness, Dickey & Pierce, P.L.C.

(57) ABSTRACT

Disclosed herein are a method for fabricating an organic thin film transistor, including treating the surfaces of a gate insulating layer and source/drain electrodes with a self-assembled monolayer (SAM)-forming compound through a one-pot reaction, and an organic thin film transistor fabricated by the method. According to example embodiments, the surface-treatment of the gate insulating layer and the source/drain electrodes may be performed in a single vessel through a single process.

10 Claims, 3 Drawing Sheets

ORGANIC THIN FILM TRANSISTOR

CROSS-REFERENCE TO RELATED APPLICATIONS

This U.S. nonprovisional application is a divisional under 35 U.S.C. §121 of U.S. application Ser. No. 12/379,856, filed Mar. 3, 2009, now U.S. Pat. No. 8,114,704 which claims priority under 35 U.S.C. §119 to Korean Patent Application No. 10-2008-0091631, filed on Sep. 18, 2008, the entire contents of which are incorporated herein by reference.

BACKGROUND

1. Technical Field

Example embodiments relate to transistors and methods for fabricating the same.

2. Description of the Related Art

The trend towards decreasing the size and weight of electric equipment has brought about an increase in the demand for flat panel display devices. In response to the increased demand, new flat panel display devices, including liquid crystal display (LCD) devices, plasma display panel (PDP) devices, and organic electroluminescence display (OELD) devices), have been developed.

For example, organic electroluminescence display devices are flexible active display devices that increasingly require development due to low temperature processes associated with a plastic substrate. Accordingly, organic thin film transistor (OTFI) devices that are applicable to organic electroluminescence display devices have been the focus of increased interest.

SUMMARY

A method for fabricating an organic thin film transistor may include forming a gate electrode, a gate insulating layer, and source/drain electrodes on a substrate. The gate insulating layer and the source/drain electrodes may be subjected to a UV/ozone treatment to form a metal oxide layer on the source/drain electrodes. The gate insulating layer and the source/drain electrodes may be immersed in a solution containing a precursor compound and a solvent to form a continuous-phase self-assembled monolayer (SAM) on the gate insulating layer and the source/drain electrodes through a one-pot reaction. An organic semiconductor layer may be formed on the self-assembled monolayer.

An organic thin film transistor according to example embodiments may include a gate electrode, a gate insulating layer, and source/drain electrodes on a substrate, the gate insulating layer and source/drain electrodes being UV/ozone-treated. A continuous-phase self-assembled monolayer may be provided on the gate insulating layer and source/drain electrodes, the continuous-phase self-assembled monolayer formed through a one-pot reaction. An organic semiconductor layer may be provided on the self-assembled monolayer. A display device according to example embodiments may include the above organic thin film transistor.

A method for fabricating a transistor structure according to example embodiments may include forming source/drain electrodes on a gate insulating layer. The source/drain electrodes and gate insulating layer may be subjected to UV/ozone treatment. A one-pot reaction may be performed with a solution containing a monolayer precursor compound to form a continuous-phase self-assembled monolayer on the source/drain electrodes and gate insulating layer. The resulting transistor structure may be further processed to attain an organic thin film transistor.

BRIEF DESCRIPTION OF THE DRAWINGS

Example embodiments may be more clearly understood if the following detailed description is viewed in conjunction with the accompanying drawings.

FIG. 1 is a schematic view of a method for surface-treating the gate insulating layer and the source/drain electrodes according to example embodiments;

FIG. 2 is a cross-sectional view of an organic thin film transistor according to example embodiments;

FIG. 3 is a current-voltage curve showing device properties of the organic thin film transistors fabricated in Example 1 and Comparative Example 1; and FIG. 4 is a current-voltage curve showing contact resistance properties of the organic thin film transistor fabricated in Example 1.

DETAILED DESCRIPTION

Figure 1:
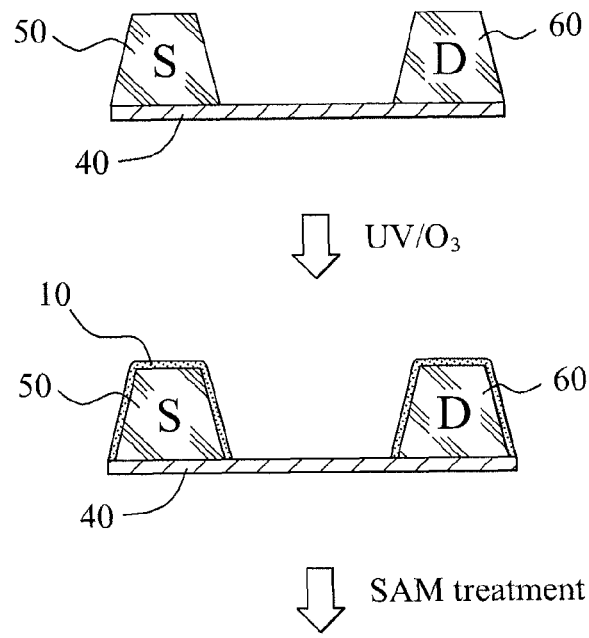
FIGS. 1-4 represent non-limiting, example embodiments of the disclosed method and transistor.

A detailed description of example embodiments is provided below with reference to the accompanying drawings. It will be understood that when an element or layer is referred to as being "on," "interposed," "disposed," or "between" another element or layer, it may be directly on, interposed, disposed, or between the other element or layer or intervening elements or layers may be present.

It will be understood that, although the terms first, second, third, and the like may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, first element, component, region, layer, or section discussed below could be termed second element, component, region, layer, or section without departing from the teachings of the present disclosure.

As used herein, the singular forms "a," "an," and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In the drawings, the thickness of layers and regions may have been exaggerated for clarity.

According to example embodiments, a method for fabricating an organic thin film transistor may result in a gate electrode, a gate insulating layer, source/drain electrodes, and/or an organic semiconductor layer arranged in this order on a substrate. The method may include subjecting the surfaces of the gate insulating layer and the source/drain electrodes to UV/ozone treatment to form a metal oxide layer on the source/drain electrode; and immersing the gate insulating layer and the source/drain electrodes in a solution containing a self-assembled monolayer (SAM) precursor compound and a solvent to form a self-assembled monolayer on the gate insulating layer and the source/drain electrodes. The method may further include annealing the surface of the source/drain electrodes after forming the self-assembled monolayer.

A more detailed description of the method according to example embodiments is provided below. In accordance with conventional methods, a substrate 20 may be initially cleaned to remove impurities present thereon and a material for a gate electrode may be deposited and patterned to form a gate electrode 30. A material for the substrate 20 on which the organic thin film transistor according to example embodiments is formed may be selected from silica, glass, plastic, or another suitable material by those skilled in the art based on the intended applications of the substrate. Examples of plastic substrates include, but are not limited to, polyethylenenaphthalate, polyethyleneterephthalate, polycarbonate, polyvinylalcohol, polyacrylate, polyimide, polynorbornene, and polyethersulfone substrates. If needed, patterning may be further performed on the substrate by a conventional technique according to the intended purposes and applications.

The gate electrode 30 may be made of a variety of materials. Examples of suitable materials for the gate electrode 30 may include: metals (e.g., gold (Au), silver (Ag), aluminum (Al), nickel (Ni), molybdenum (Mo), tungsten (W), and chromium (Cr)) and alloys thereof (e.g., molybdenum/tungsten (Mo/W) alloys); metal oxides (e.g., indium-tin oxide (ITO), indium-zinc oxide (IZO)); and electrically-conductive polymers (e.g., polythiophene, polyaniline, polyacetylene, polypyrrole, polyphenylene vinylene, and polyethylenedioxythiophene (PEDOT)/polystyrenesulfonate (PSS) mixtures). These above materials may be used individually or in combination with each other. The thickness of the gate electrode may be in the range of about 500 Å to about 2,000 Å. The gate electrode 30 may be patterned by a conventional method according to the intended purposes and applications.

A gate insulating layer 40 may be formed on the gate electrode 30. The gate insulating layer 40 may be formed of a conventional insulator having a relatively high-dielectric constant. Useful insulators include, but are not limited to, ferroelectric insulators, inorganic insulators, and organic insulators.

Examples of suitable insulators may include ferroelectric insulators selected from the group consisting of $Ba_{0.33}Sr_{0.66}TiO_3$ (BST), $Al_2O_3$, $Ta_2O_5$, $La_2O_5$, $Y_2O_3$, and $TiO_2$; inorganic insulators selected from the group consisting of $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$ (BZT), $BaTiO_3$, $SiTiO_3$, $Bi_4Ti_3O_{12}$, $SiO_2$, $SiN_x$, and AlON; and organic insulators selected from the group consisting of polyimide, benzocyclobutene (BCB), parylene, polyacrylate, polyvinyl alcohol, and polyvinyl phenol.

The thickness of the gate insulating layer 40 may be in the range of about 1,000 Å to about 10,000 Å, but the dimensions are not limited thereto. The gate insulating layer 40 may be patterned by a conventional method according to the intended applications and purposes.

Methods for forming the gate insulating layer 40 are not particularly limited, and examples thereof may include thermal evaporation and solution processes (e.g., spin coating, inkjet printing, and printing). If needed, soft baking may be performed at about 40° C. to about 100° C. for about 1 minute to about 30 minutes, or hard baking may be performed at about 100° C. to about 200° C. for about 30 minutes to about 3 hours.

Source/drain electrodes 50 and 60 may be formed on gate insulating layer 40. The source/drain electrodes 50 and 60 may be formed to a thickness of 500 Å to 700 Å by a photolithographic process using a metal selected from gold (Au), platinum (Pt), nickel (Ni), palladium (Pd), silver (Ag), iridium (Ir), and rhodium (Rh).

The surfaces of the gate layer 40 and the source/drain electrodes 50 and 60 may be UV/ozone-treated. FIG. 1 is a schematic view illustrating a method for surface-treating the gate insulating layer and the source/drain electrodes according to example embodiments. As shown in FIG. 1, a metal oxide layer 10 may be formed on the surface of the source/drain electrodes 50 and 60 as a result of the surface-treatment.

The UV/ozone treatment may be carried out by a conventional process known in the art. The UV/ozone treatment may be carried out by irradiating the surfaces of the source/drain electrodes 50 and 60 using a UV lamp having a power of about 0.2 to 0.5 W/cm³ at a wavelength of about 240 to 270 nm for about 30 to 60 seconds, although the parameters are not limited thereto.

The thickness of the metal oxide layer 10 formed by the UV/ozone treatment may be the range of about 10 to 30 Å, although the dimensions are not limited thereto. The UV/ozone treatment may decrease the water contact angle of the oxidized source/drain electrodes 50 and 60. Accordingly, the surfaces of the source/drain electrodes 50 and 60 may become hydrophilic.

The UV/ozone-treated gate insulating layer 40 and source/drain electrodes 50 and 60 may be immersed in a solution containing a self-assembled monolayer precursor compound and a solvent to thereby form a self-assembled monolayer 70 through a one-pot reaction.

The term "one-pot reaction" as used herein refers to a reaction performed in a single vessel. The term "self-assembled monolayer (SAM)" as used herein refers to a thin monolayer wherein surface-active molecules present in a reaction solution are spontaneously adsorbed on the surface of a specific substrate to produce chemical bonds therebetween. The precursor compound for forming the self-assembled monolayer may be represented by Formula 1 below:

$$X-Y-Z \quad (1)$$

wherein X may be a hydrophilic group selected from the group consisting of —$Si(OCH_3)_3$, —$Si(OCH_2CH_3)_3$, —COOH, —SOOH, —POOOH, —$SiCl(CH_3)_2$, —$SiCl_2CH_3$, —$SiCl_3$, —$SiI_3$, —Si(OH), —SiCl, —$Si(OEt)_3$, —$Si(OMe)_3$, —$SO_3H_2$, —COCl, —$PO_3H$, —$SO_2Cl$, —$OPOCl_2$, and —$POCl_2$;

Y may be a hydrophobic group selected from —$(CH_2)_n$— (with n being an integer from 2 to 19) and —$(CF_2)_n$— (with n being an integer from 2 to 10); and Z may be a group capable of controlling a dipole moment of the precursor compound and may be selected from the group consisting of —H, —OH, —$NO_2$, —$NH_2$, —SH, —$CH_3$, —CF, —Cl, and —Ph, although suitable chemical groups are not necessarily limited thereto.

As a result of the immersion step, the hydrophilic groups contained in the precursor compound may bond to the hydrophilic groups contained in the gate insulating layer 40 and the metal oxide layer 10 to form a continuous-phase self-assembled monolayer 70 on the surface of the gate insulating layer 40 and the source/drain electrodes 50 and 60, as shown in FIG. 1.

A conventionally-used organic solvent, water, or a mixture thereof may be used without limitation. Examples of suitable organic solvents may include, but are not limited to, alcohols (e.g., methyl alcohol, ethyl alcohol, n-propyl alcohol, isopropyl alcohol, n-butyl alcohol, sec-butyl alcohol, t-butyl alcohol, isobutyl alcohol, and diacetone alcohol); ketones (e.g., acetone, methylethylketone, methylisobutylketone); glycols (e.g., ethyleneglycol, diethyleneglycol, triethyleneglycol, propyleneglycol, butyleneglycol, hexyleneglycol, 1,3-propanediol, 1,4-butanediol, 1,2,4-butantriol, 1,5-pentanediol, 1,2-hexanediol, 1,6-haxanediol); glycol ethers (e.g., ethyleneglycol dimethyl ether, and triethyleneglycol diethyl ether); glycol ether acetates (e.g., propylene glycol monomethyl ether acetate (PGMEA)); acetates (e.g., ethylacetate, butoxyethoxy ethyl acetate, butyl carbitol acetate (BCA), dihydroterpineol acetate (DHTA)); terpineols (e.g., trimethyl pentanediol monoisobutyrate (TEXANOL)); dichloroethene (DCE); chlorobenzene; and N-methyl-2-pyrrolidone (NMP). The above organic solvents may be used individually or in combination with each other or other solvents.

The concentration of the precursor compound in the solution may be determined by those skilled in the art according to the intended applications and purposes and may be in the range of about 5 to about 20 mM, when taking into consideration the surface-modification level and the decrease in contact resistance of the gate insulating layer 40 and the source/drain electrodes 50 and 60. The immersion step may be performed without particular limitation and may be carried out at room temperature for about 20 to 80 minutes.

The method may further include annealing the continuous-phase self-assembled monolayer formed on the gate insulating layer 40 and the source/drain electrodes 50 and 60. This annealing process may improve the molecular arrangement of the self-assembled monolayer. The annealing process may be performed with a conventional process without limitation and may be performed at about 100 to 120° C. for about 20 minutes to one hour.

An organic semiconductor material may be coated on the self-assembled monolayer by a conventional method to form an organic semiconductor layer 80. Any organic semiconductor material known in the art may be used without limitation. For example, those skilled in the art may select one or more materials from the group consisting of conventional lower-molecular weight or oligomer organic semiconductor materials and conventional higher-molecular weight organic semiconductor materials.

Examples of organic semiconductor materials may include, but are not necessarily limited to, anthracene, tetracene, pentacene, oligothiophene, polythiophene, merocyanine, copper phthalocyanine, perylene, polyaniline, polyacetylene, polypyrrole, polyphenylene, rubrene, coronen, anthradithiophene, polyfluorene, polyphenylenevinylene, polythienylthiazole, and derivatives thereof. The organic semiconductor material may be used individually or in combination thereof.

The thickness of the organic semiconductor layer 80 may be about 300 to 2,000 Å. The organic semiconductor layer 80 may be patterned by a conventional method according to the intended applications and purposes. Coating processes for forming the organic semiconductor layer are not particularly limited, and examples thereof may include thermal evaporation, screen printing, printing, spin coating, dip coating, and imprinting.

Figure 2:
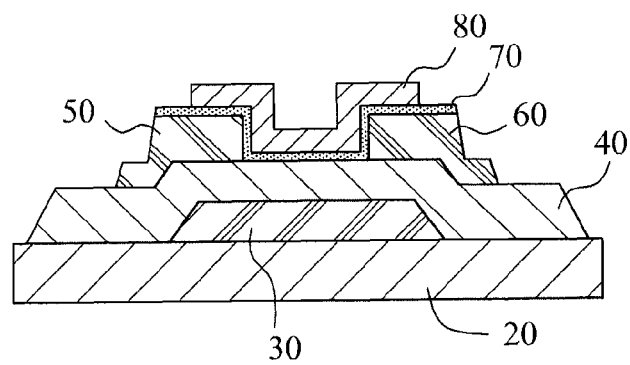

The organic thin film transistor fabricated by the method according to example embodiments may have a structure in which the gate electrode 30, the gate insulating layer 40, the source/drain electrodes 50 and 60, the continuous-phase self-assembled monolayer 70, and the organic semiconductor layer 80 are laminated in this order on the substrate 20, as shown in FIG. 2.

The continuous-phase self-assembled monolayer 70 may be formed between the organic semiconductor layer 80 and the gate insulating layer 40 and the source/drain electrodes 50 and 60, thus reducing or minimizing the hole injection barrier between the source/drain electrodes 50 and 60 and the organic semiconductor layer 80 and controlling the interfacial interaction force between the gate insulating layer 40 and the organic semiconductor layer 80.

Accordingly, the organic thin film transistor fabricated by the above method may be used to fabricate display devices, e.g., electroluminescent devices, liquid crystal display devices, and electrophoretic display devices. Example embodiments will now be described in further detail with reference to the following examples. It should be understood that these examples are merely provided for illustrative purposes only and are not intended to limit the scope of the present disclosure.

EXAMPLES

Example 1

Fabrication of Organic Thin Film Transistor

A gate electrode is fanned to a thickness of 2,000 Å on a cleaned glass substrate using molybdenum by a sputtering technique. A gate insulating layer is formed to a thickness of 3,000 Å thereon using $SiO_2$ by chemical vapor deposition (CVD). Source/drain electrodes are formed to a thickness of 700 Å thereon using gold (Au) by a photolithographic process.

The surfaces of the gate insulating layer and source/drain electrodes are UV/ozone-treated using a lamp having a power of 0.2 $W/cm^3$ for 30 minutes. Subsequently, the surfaces of the gate insulating layer and the source/drain electrodes are dip-coated using a solution (10 mM) of octyltrichlorosilane (OTS) in hexane for 20 minutes, washed, and dried on a hot plate at 120° C. for 20 minutes to form a self-assembled monolayer.

A 1 wt % solution of poly(oligothiophene-thiozole) derivative (molecular weight: 20,000 g/mol, polymerization degree: 20) in chlorobenzene is spin-coated on the self-assembled monolayer at 1,000 rpm to form an organic semiconductor layer with a thickness of 700 Å. The organic semiconductor layer is thermal-treated at 150° C. for one hour to fabricate an organic thin film transistor.

Example 2

Fabrication of Organic Thin Film Transistor

An organic thin film transistor is fabricated in the same manner as in the Example 1, except that silver (Ag) is used as a material for the electrode.

Comparative Example 1

Fabrication of Organic Thin Film Transistor

A gate electrode is formed to a thickness of 2,000 Å on a cleaned glass substrate using molybdenum by a sputtering technique. A gate insulating layer is formed to a thickness of 3,000 Å thereon using $SiO_2$ by chemical vapor deposition (CVD). Source/drain electrodes are formed to a thickness of 700 Å thereon using gold (Au) by a photolithographic process.

The surfaces of the gate insulating layer and source/drain electrodes are cleaned with oxygen plasma. Then, the surface of the gate insulating layer is dip-coated using a solution (10 mM) of octyltrichlorosilane (OTS) in hexane for 20 minutes, washed, and dried on a hot plate at 120° C. for 20 minutes to form a self-assembled monolayer. Then, the surfaces of the source/drain electrodes are immersed in a solution of thiolate in ethanol. A 1 wt % solution of poly(oligothiophene-thiozole) derivative (molecular weight: 20,000 g/mol, polymerization degree: 20) in chlorobenzene is spin-coated thereon at 1,000 rpm to form a semiconductor layer with a thickness of 700 Å. The semiconductor layer is thermal-treated at 150° C. for one hour to fabricate an organic thin film transistor.

Experimental Example 1

Evaluation of Current Mobility of Organic Thin Film Transistor

To evaluate electrical properties of the organic thin film transistors fabricated in Example 1 and Comparative Example 1, electric mobility was measured with a semiconductor analyzer (4200-SCS, available from Keithley Instrument Inc.). The results are shown in FIG. 3.

Figure 3:
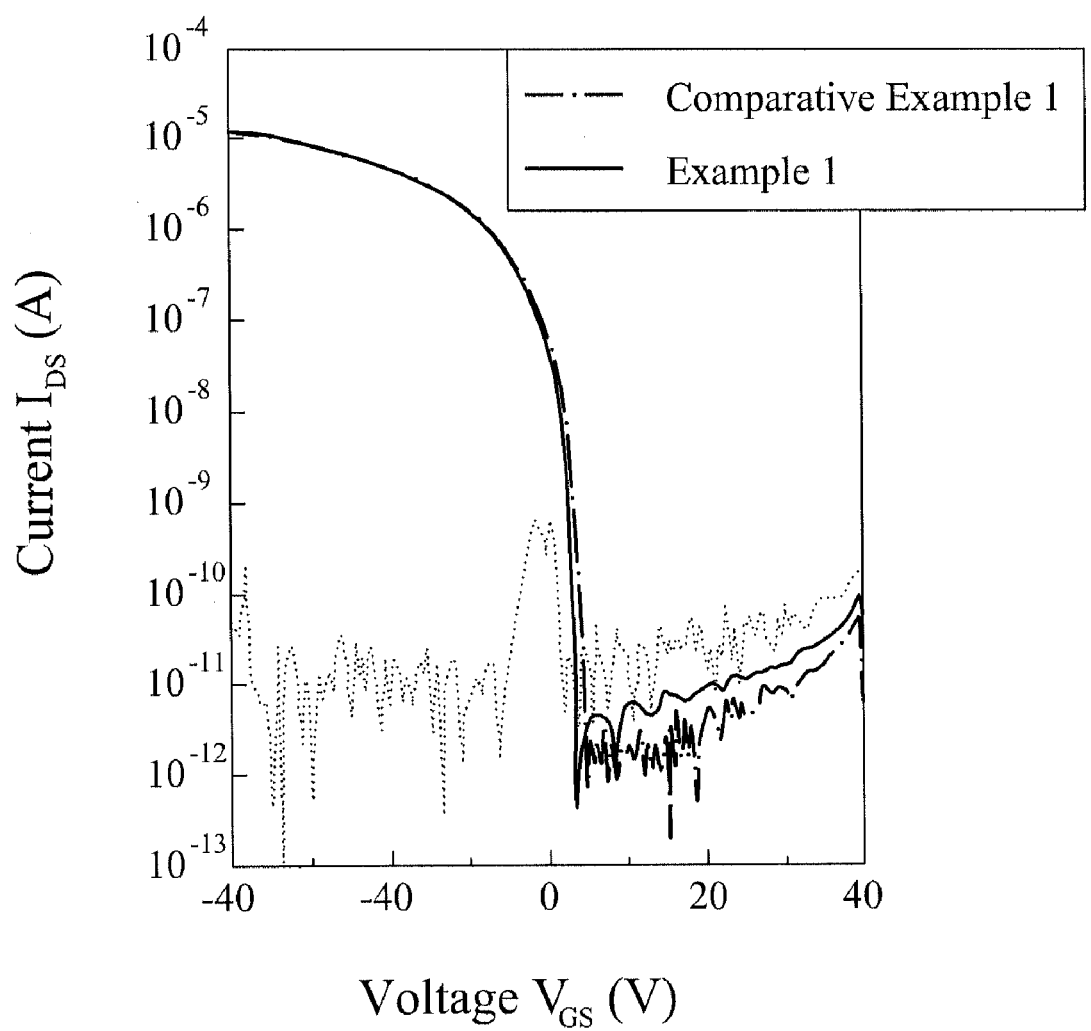

As can be seen from FIG. 3, carrier mobility of the organic thin film transistor fabricated in Example 1 is 0.28 cm$^2$/Vs, comparable to that of the organic thin film transistor fabricated in Comparative Example 1. This result indicates that an organic thin film transistor may be fabricated with a relatively simple process without deteriorating the electrical properties.

Experimental Example 2

Evaluation of Contact Resistance of Organic Thin Film Transistor

Figure 4:
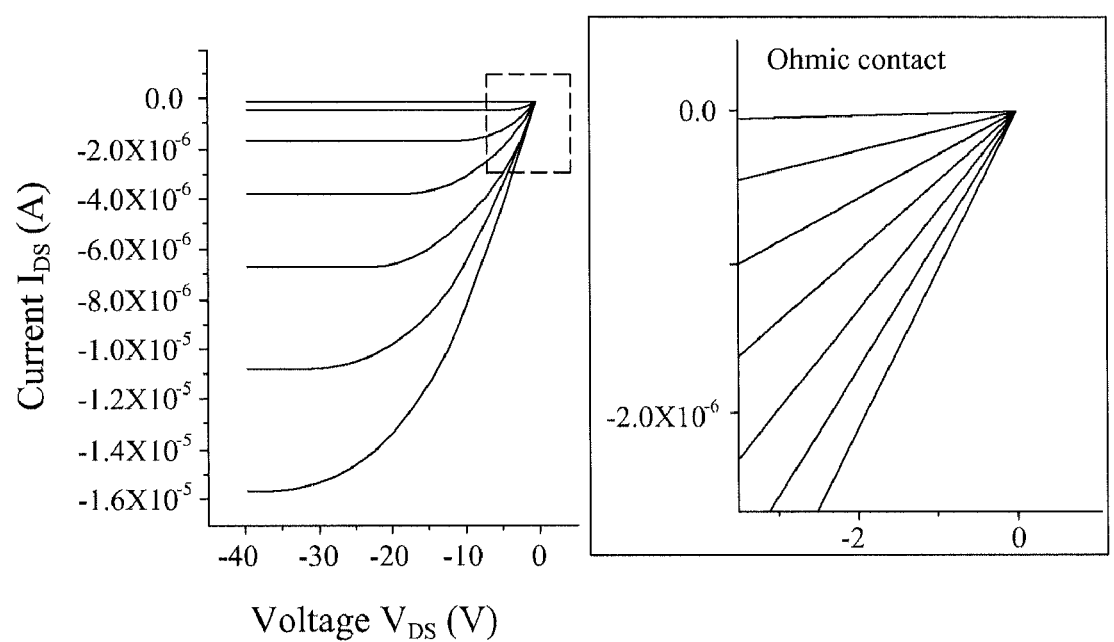

The contact resistance of the organic thin film transistor in Example 1 was measured with the same apparatus as in Experimental Example 1. The results are shown in FIG. 4. As can be seen from FIG. 4, the organic thin film transistor of Example 1 exhibits ohmic contact properties. This result indicates that the organic thin film transistor according to example embodiments may be utilized in applications including a variety of display devices.

In the method according to example embodiments, the surfaces of a gate insulating layer and source/drain electrodes are treated with a self-assembled monolayer (SAM)-forming compound through a one-pot reaction. As a result, an organic thin film transistor fabricated by the method is capable of controlling both the contact resistance between the source/drain electrodes and an organic semiconductor layer and the crystal orientation of the organic semiconductor layer on the gate insulating layer.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. An organic thin film transistor, comprising:
   a gate electrode, a gate insulating layer, and source/drain electrodes on a substrate, the gate insulating layer and source/drain electrodes being UV/ozone-treated;
   a metal oxide layer on the source/drain electrodes;
   a continuous-phase self-assembled monolayer on the gate insulating layer and source/drain electrodes, the continuous-phase self-assembled monolayer formed through a one-pot reaction; and
   an organic semiconductor layer on the self-assembled monolayer.

2. The organic thin film transistor of claim 1, wherein the gate electrode has a thickness of about 500 to 2000 Å.

3. The organic thin film transistor of claim 1, wherein the gate insulating layer is formed of a ferroelectric insulator selected from the group consisting of $Ba_{0.33}Sr_{0.66}TiO_3$, $Al_2O_3$, $Ta_2O_5$, $La_2O_5$, $Y_2O_3$, and $TiO_2$.

4. The organic thin film transistor of claim 1, wherein the gate insulating layer is formed of an inorganic insulator selected from the group consisting of $PbZr_{0.33}Ti_{0.66}O_3$, $Bi_4Ti_3O_{12}$, $BaMgF_4$, $SrBi_2(TaNb)_2O_9$, $Ba(ZrTi)O_3$, $BaTiO_3$, $SrTiO_3$, $Bi_4Ti_3O_{12}$, $SiO_2$, $SiN_x$, and AlON.

5. The organic thin film transistor of claim 1, wherein the gate insulating layer is formed of an organic insulator selected from the group consisting of polyimide, benzocyclobutene, parylene, polyacrylate, polyvinyl alcohol, and polyvinyl phenol.

6. The organic thin film transistor of claim 1, wherein the source/drain electrodes are formed of at least one metal selected from the group consisting of gold, platinum, nickel, palladium, silver, iridium, and rhodium.

7. The organic thin film transistor of claim 1, wherein the organic semiconductor layer is formed of a compound selected from the group consisting of anthracene, tetracene, pentacene, oligothiophene, polythiophene, merocyanine, copper phthalocyanine, perylene, polyan iline, polyacetylene, polypyrrole, polyphenylene, rubrene, coronen, anthradithiophene, polyfluorene, polyphenylenevinylene, and polythienylthiazole.

8. A display device comprising the organic thin film transistor of claim 1.

9. The organic thin film transistor of claim 1, wherein the continuous-phase self-assembled monolayer includes a hydrophilic group bonded to the gate insulating layer, the hydrophilic group selected from the group consisting of —SOOH, —SiCl(CH$_3$)$_2$, —SiCl$_2$CH$_3$, —SiI$_3$, —Si(OH), —SiCl, —COCl, —SO$_2$Cl, —OPOCl$_2$, and —POCl$_2$.

10. The organic thin film transistor of claim 1, wherein the metal oxide layer has a thickness ranging from 10 to 30 Å.

* * * * *